US006317381B1

(12) United States Patent
Gans et al.

(10) Patent No.: US 6,317,381 B1
(45) Date of Patent: *Nov. 13, 2001

(54) METHOD AND SYSTEM FOR ADAPTIVELY ADJUSTING CONTROL SIGNAL TIMING IN A MEMORY DEVICE

(75) Inventors: Dean Gans; John R. Wilford; John D. Porter, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/457,429

(22) Filed: Dec. 7, 1999

(51) Int. Cl.$^7$ ....................................... G11C 7/00
(52) U.S. Cl. ............................ 365/233; 365/194
(58) Field of Search ................... 365/233, 194; 326/93; 327/149, 153, 161

(56) References Cited

U.S. PATENT DOCUMENTS 5,550,489 * 8/1996 Raab ....................................... 326/93
6,111,812 * 8/2000 Gans et al. ......................... 365/233

* cited by examiner

Primary Examiner—Vu A. Le
(74) Attorney, Agent, or Firm—Dorsey & Whitney LLP

(57) ABSTRACT

A method and apparatus is described for selectively adjusting control signal timing in a memory device as a function of the frequency of an externally applied clock signal. The memory device includes clock sensing circuitry that receives the clock signal and responsively produces a plurality of speed signals that transition a plurality of times corresponding in number to the frequency of the clock signal. The memory device also includes a control signal delay circuit that receives a memory command signal and the speed signals, and responsively produces a delayed control signal having a time delay from the command signal corresponding to the number of transitions of the speed signal value. Significantly, the control signal is generated during a period of the clock signal that immediately follows a period of the clock signal when the delay of the control signal delay circuit is set.

31 Claims, 16 Drawing Sheets

METHOD AND SYSTEM FOR ADAPTIVELY ADJUSTING CONTROL SIGNAL TIMING IN A MEMORY DEVICE

TECHNICAL FIELD

The present invention relates generally to control signal timing in semiconductor memory devices, and more particularly to a method and apparatus for adjusting control signal timing in such memory devices as a function of the operating speed of the device.

BACKGROUND OF THE INVENTION

Semiconductor memory devices are used in a wide variety of applications. Such memory devices receive data for storage, in what is called a Write operation, and provide stored data to devices external to the memory, in what is called a Read operations. Typically, the memory device is accessed through a bus or multiple bus system by an external device or bus-master, such as a microprocessor, memory controller, or application specific integrated circuit (ASIC). The bus transfers address, data, and control signals between the memory device and the bus-master accessing the memory device.

The operation of many of today's high speed memory devices, such as synchronous dynamic random access memories ("SDAMs"), synchronous link DRAMs ("SLDRAMs") and RAMBUS DRAMs ("RDRAMS"), is controlled by one or more clock signals. The clock signal synchronizes the operation of the memory device to other device, such as memory controllers, and it synchronizes the operation of circuits within the memory device to each other.

Although the operating speeds of some portions of a memory device are controlled by the frequency of the clock signal, some operations in a memory device inherently require a fixed period of time. For example, the minimum period of time required for write data to be coupled to the array of a memory device or for read data to the coupled from the array of a memory device is substantially fixed. Thus, the number of clock periods occurring during the time required for data to be coupled to or from the array is directly proportional to the clock frequency. For this reason, there may be no fixed relationship between the timing of control signals that cause the data to be coupled to or from the array at the maximum rate and the number of clock signals occurring during that time.

The control signals could be generated simply by generating the control signals after a fixed number of clock periods have elapsed corresponding to the period required for the memory operation at the highest clock frequency that will be used with the memory device. However, this approach would cause the memory device to operate at less than optimal speed when a lower frequency clock signal was used. For example, a memory operation requiring 100 ns to complete might require a control signal to be generated after 10 clock periods using a clock signal having a period of 10 ns. However, when the memory device was used with a clock signal having a clock period of 50 ns, the same control signal would be generated after 500 ns, which is 400 ns slower than the memory device would be capable of operating. As a result, it can be difficult to generate control signals to cause memory operations to occur at the maximum rate when the memory device operates at a variable clock speed.

SUMMARY OF THE INVENTION

In accordance with the present invention, a method and system is provided for selectively adjusting control signal timing in an integrated circuit, such as a memory device, that receives a clock signal and performs internal operations responsive to a control signal. Clock sensing circuitry receives the clock signal and responsively produces a speed signal that transitions a plurality of time corresponding in number to the frequency of the clock signal. Delay circuitry receives the control signal and the speed signal, and responsively produces a delayed control signal, with the time-delay relative to the control signal corresponding to the number of transitions of the speed signal.

The control signal may be any of a wide variety of control signals produced internal to a memory device and controlling the internal operations thereof. For example, the control signal may be a data output control signal controlling the timing of operations of data output circuitry included within the memory device. As another example, the control signal may be an address select control signal controlling the timing of access to an addressed location within the memory device.

DETAILED DESCRIPTION OF THE INVENTION

The following is a description of a method and apparatus for adjusting control signal timing in a memory device. In this description, certain details are set forth in order to provide a thorough understanding of various embodiments of the present invention. It will be clear to one skilled in the art, however, that the present invention may be practiced without these details. In other instances, well-known circuits, circuit components, and control signals and associated timing protocols have not been shown or described in detail in order to avoid unnecessarily obscuring the description of the various embodiments of the invention.

Figure 1:
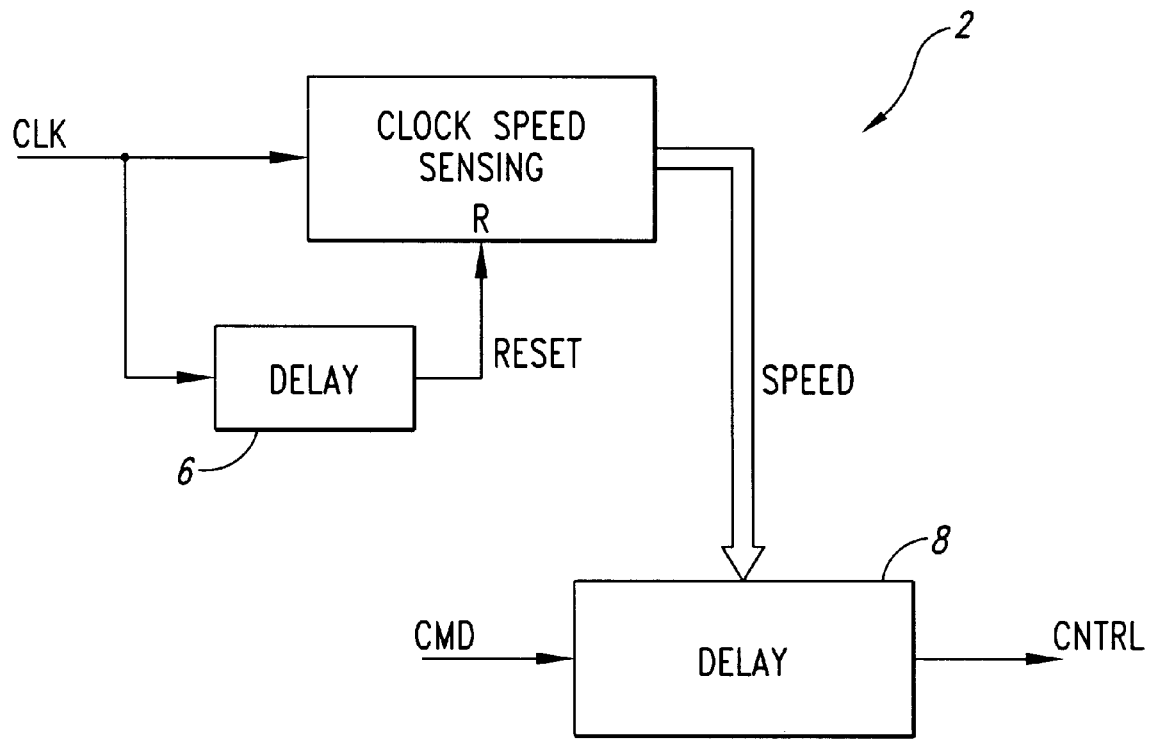
FIG. 1 is high-level block diagram of a system for adaptively adjusting control signal timing in accordance with one embodiment of the invention.

FIG. 1 depicts a system 2 for adaptively adjusting the timing of a control signal in accordance with an embodiment of the present invention. The system 2 includes a clock speed sensing circuit 4 that receives a clock CLK signal and a delay circuit 6 that also receives the CLK signal. The clock speed sensing circuit 4 outputs a signal SPEED that toggles a number of times at a rate corresponding to the propagation of the CLK signal through delay stages (not shown in FIG. 1) in the clock speed sensing circuit 4. The delay circuit 6 then generates a reset signal a fixed period of time after the CLK signal.

The SPEED signals are applied to a delay circuit 8 having a plurality of stages that are selectively enabled depending upon the number of times the SPEED signals toggles. The delay circuit 8 then delays generates a control signal CONT responsive to a command signal CMD with a delay relative to the CMD signal corresponding to the number of enabled delay stages of the delay circuit 8.

Figure 2:
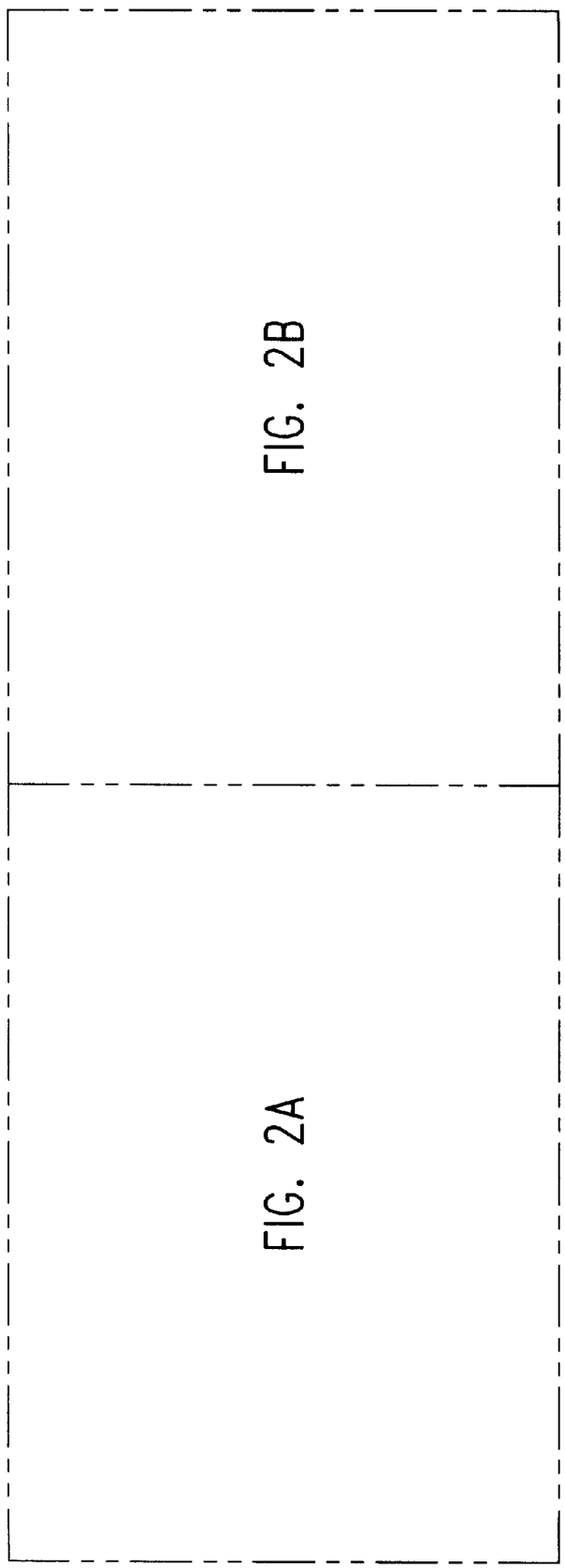
FIG. 2 is a logic diagram of one embodiment of a clock speed sensing system that may be used in the system of FIG. 1.
Figure 2A:
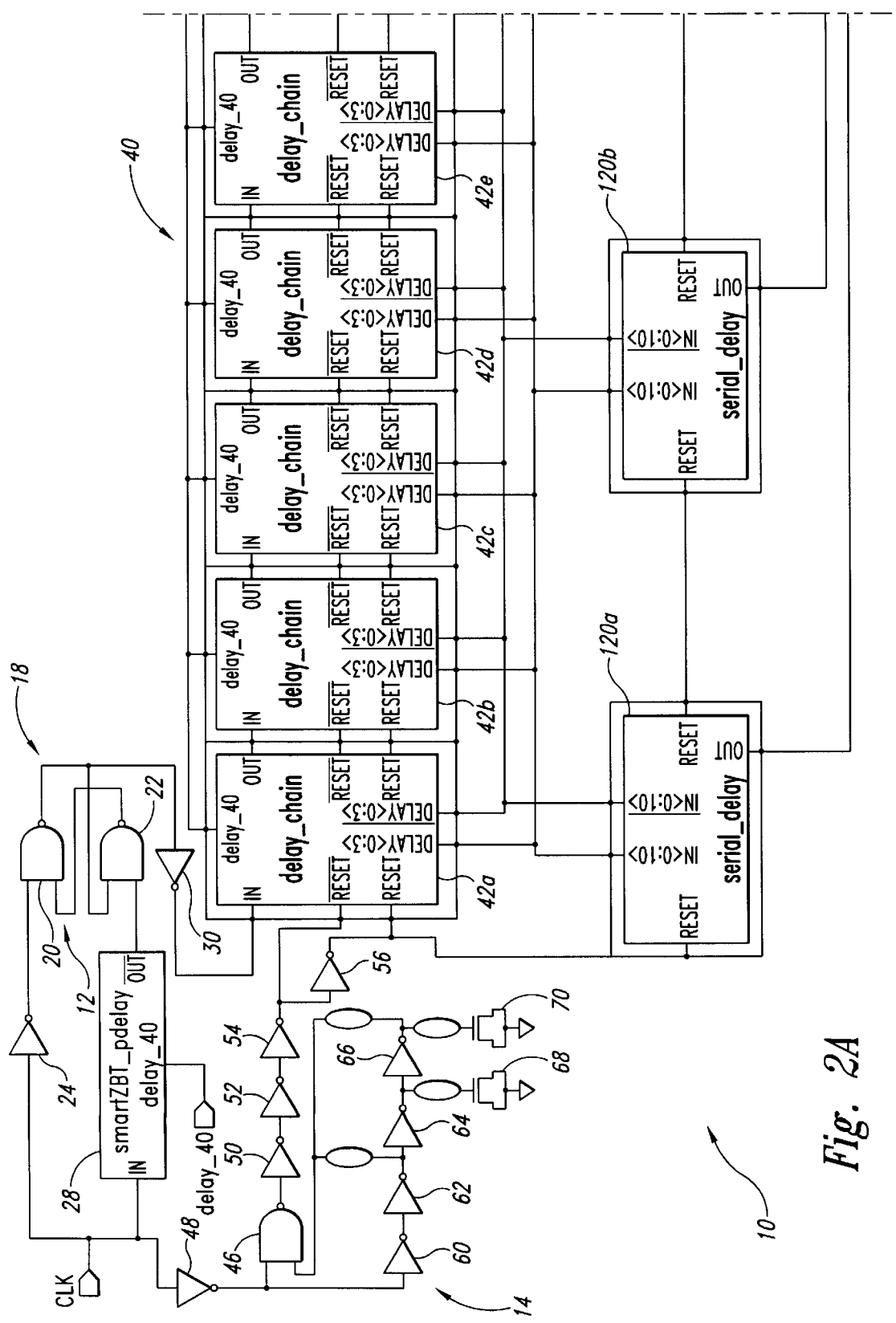
Figure 2B:
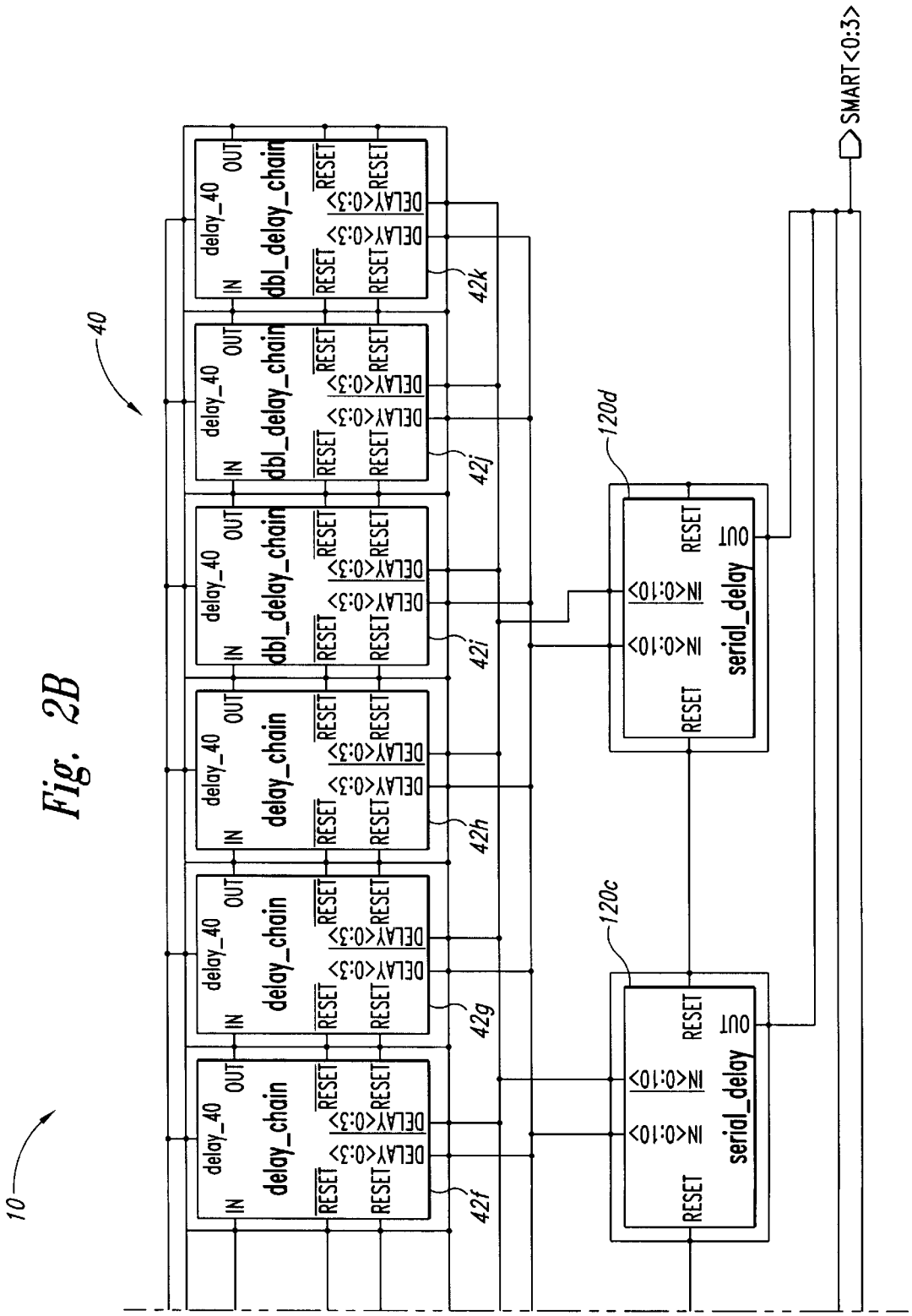
Figure 3:
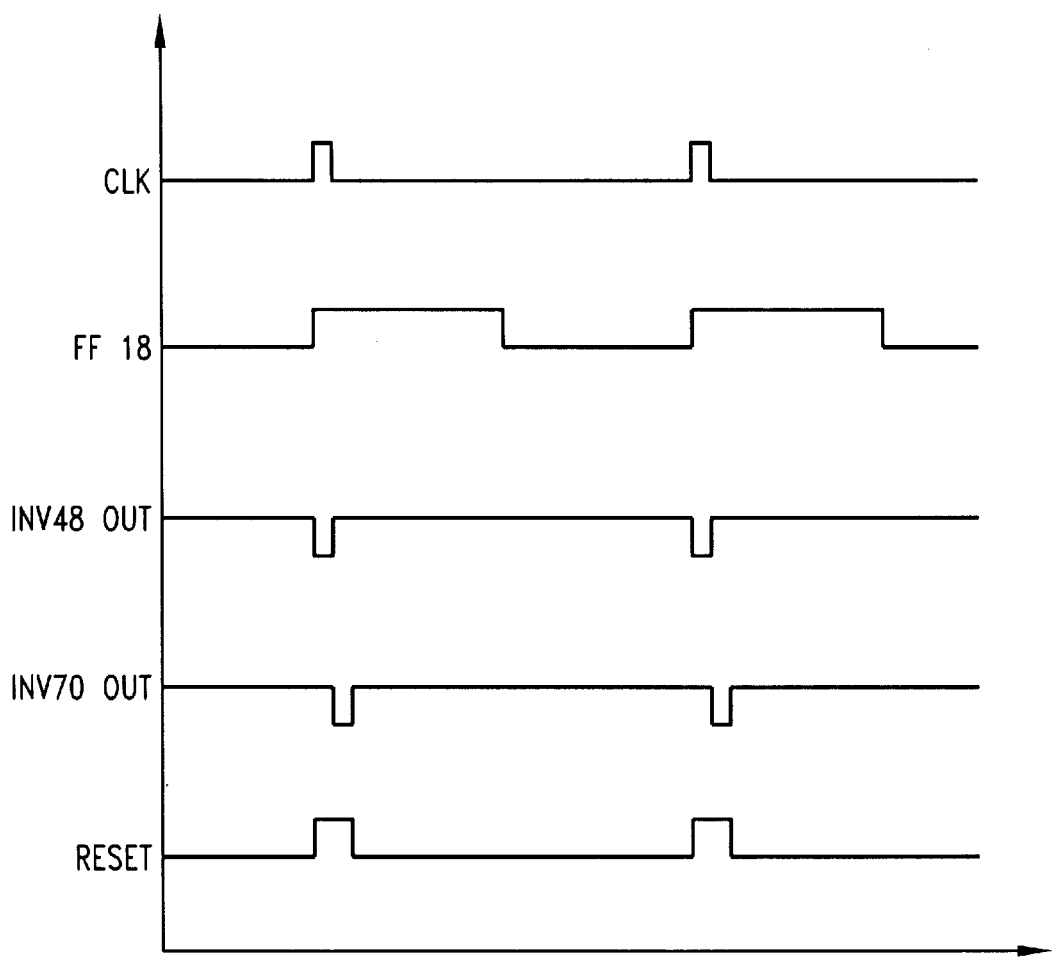
FIG. 3 is a timing diagram showing various signals present in the clock speed sensing system of FIG. 2.

A more detailed embodiment of a system 10 according to one embodiment of the invention is shown in FIG. 2 and will be explained in with reference to the timing diagram shown in FIG. 3. The CLK signal which, as shown in FIG. 3, is in the form of a series of short, periodic pulses, is applied to both an initiation circuit 12 and a reset circuit 14. The initiation circuit 12 includes a flip-flop 18 formed by a pair of NAND gates 20, 22. The CLK signal is coupled to the flip-flop 18 through an inverter 24 so that the flip-flop 18 is set on the rising edge of the CLK pulse. The CLK signal is also applied to a delay circuit 28 that outputs a low a predetermined period after the rising edge of the CLK signal. As shown in FIG. 3, the propagation delay of the delay circuit 28 is less than the period of the CLK signal, although it may be longer or shorter than illustrated in FIG. 3. The propagation delay of the delay circuit 28 preferably corresponds to a minimum time after the CLK signal for a memory operation to be initiated by the CNTRL signal (FIG. 1). The output of the delay circuit 28 resets the flip flop 18 so that an IN signal generated at the output of an inverter 30 transitions low responsive to each CLK pulse and then transitions high a period of time later corresponding to the delay of the delay circuit 28. As explained in greater detail below, the rising transitions of the IN of the signal propagates through a delayed chain 40 consisting of a plurality of delay stages 42a–k.

The reset circuit 14 includes a NAND gate 46 that receives the CLK pulses through an inverter 48. Thus, on the rising edge of the CLK pulse, the output of the inverter 48 transitions low, thereby causing the output of the NAND gate 46 to transition high. This high is coupled through three inverters 50–54 to generate an active RESET* signal and through an inverter 56 to generate its complement RESET (as used herein, signals are designated, for example, RESET and its complement RESET* or RESET). The RESET signals reset each of the delay stages 42a–k to an initial value, as explained below.

The output of the inverter 48 is also coupled to the NAND gate 46 through four inverters, through which are coupled to a capacitor 68, 70. The purpose of the inverters 60–66 and a capacitors 68, 70 used to apply a delayed low to the NAND gate 46 responsive to the low at the output of the inverter 48 to effectively "stretch" the short low-going pulse of the output of the inverter 48, as shown in FIG. 3. As a result, the output of the NAND gate 46 transitions high for a period of sufficient duration to reset the delay stages 42a–k. Thus, on the rising edge of each CLK pulse, the delay stages 42a–k are reset, and, the short time later corresponding to the propagation delay of the delay circuit 28, the rising transition of the IN signal starts propagating through the delay stages 42a–k. The rising transition of the IN signal propagates through the delay stages 42a–k until the next RESET pulse is generated on the rising edge of the next CLK pulse.

Figure 4:
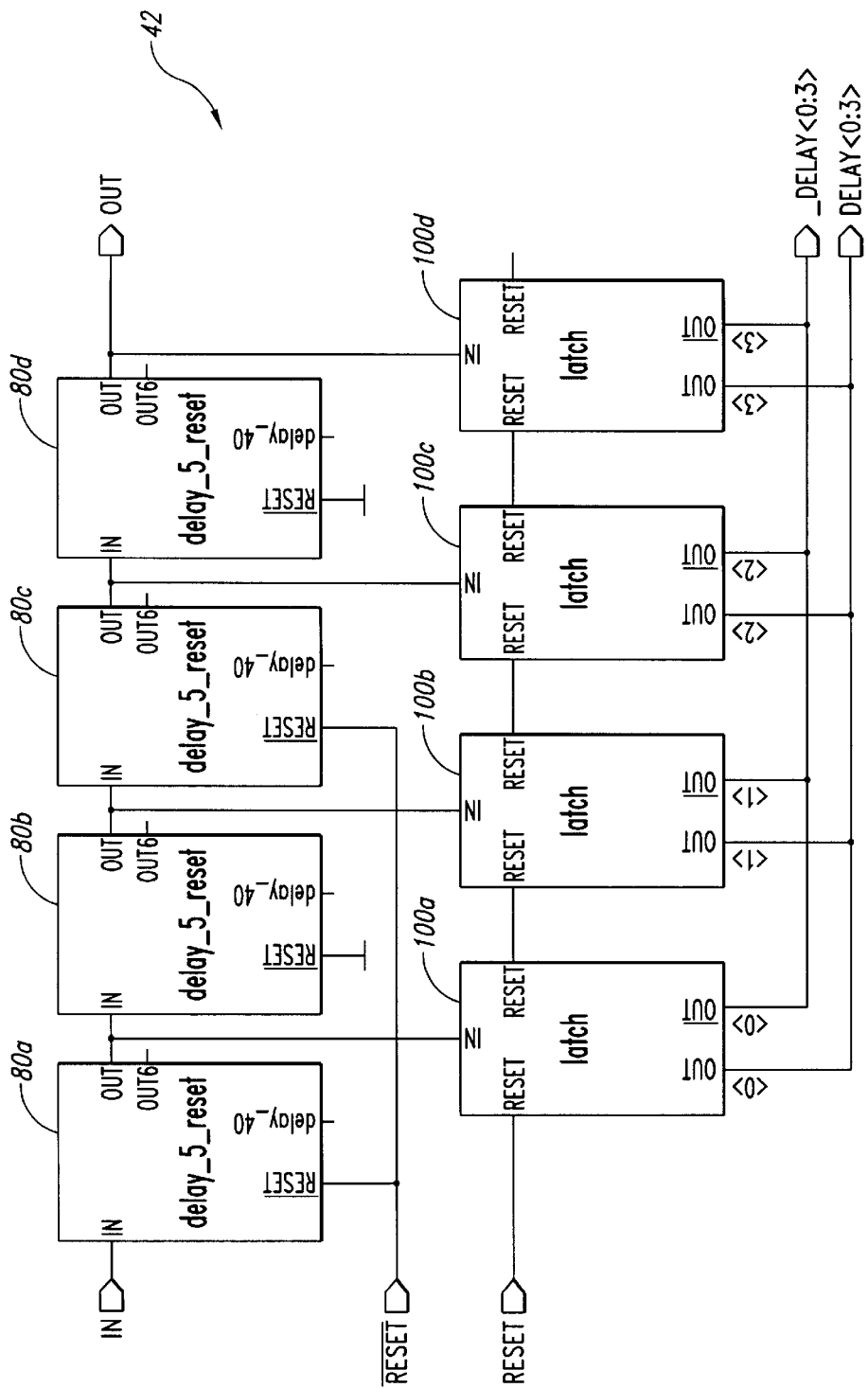
FIG. 4 is a logic diagram showing one embodiment of a delay stage used in the clock speed sensing system of FIG. 3.

The delay stages 42a–k are shown in greater detail in FIG. 4. Each of the delay stages 42a–k includes four delay elements 80a–d and four corresponding latches 100a–d. The delay elements 80a–d are enabled by the RESET* signals 84 being inactive high, as explained below. The rising edge of the IN signal is then coupled successively through each of the delay elements 80a–d. When the rising edge of the IN signal reaches each of the delay elements 80a–d, its output OUT transitions high. Thus, the output OUT of each of the delay elements 80a–d transition high in sequence.

Figure 5:
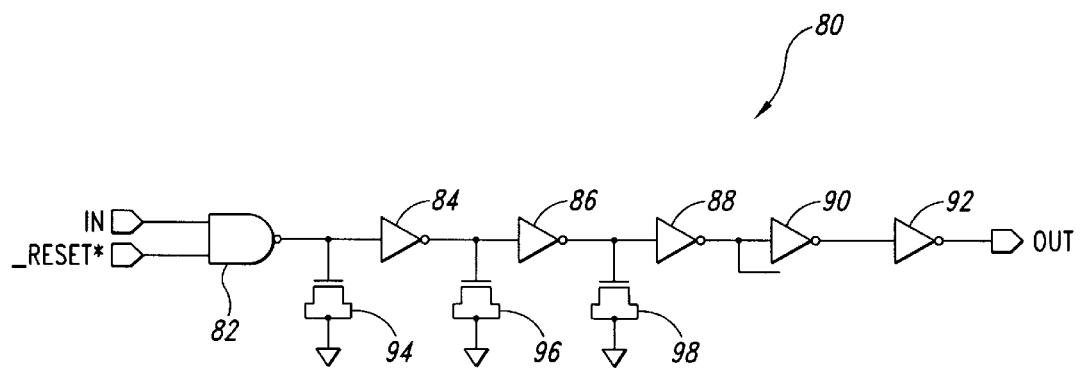
FIG. 5 is a logic diagram showing one embodiment of a delay element used in the delay stage of FIG. 4.

Each of the delay elements 80a–d is shown in greater detail in FIG. 5. The delay elements 80 includes a NAND gate 84 that receives the IN signal and the complementary RESET* signal. Thus, as long as the delay stages 42a–k are not being reset, the output of the NAND gate 82 transitions low responsive to the high transition of the IN signal. The output of the NAND gate 82 is coupled through five inverters 84–92 to generate the output signal OUT. A respective capacitor 94–98 is coupled to the outputs of the NAND gate 82 and the inverters 84–86 to delay signal transitions. As a result, transitions of the output signal OUT are delayed relative to transitions of the signal IN.

Figure 6:
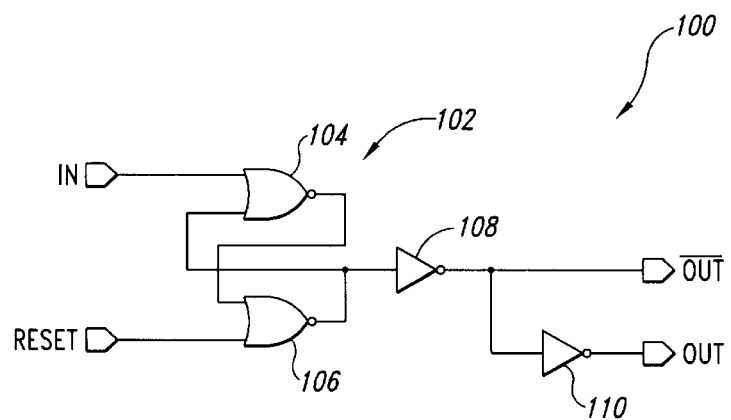
FIG. 6 is a logic diagram of one embodiment all of a latch circuit used in the delay stage of FIG. 4.

Returning, now, to FIG. 4, the output OUT of the each delay element 80a–d is coupled through a respective latch 100a–d, as explained above. The latches 100a–d are shown in greater detail in FIG. 6. Each of the latches 100 includes a flip-flop 102 formed by a pair of NOR gates 104, 106, and a pair of inverters 108,110 driven by the NOR gate 106. The flip-flop 100 is set by the rising edge of the IN signal and reset by the RESET* signal which, as explained above, is generated at each CLK pulse. Thus, when the rising edge of the IN signal propagates to each delay element 80a–d (FIG. 4), the flip flop 102 is set, thereby generating an active low OUT* signal and an active high OUT signal. As further shown in FIG. 4, the four outputs of the latches 100a–d in each of the delay stages 42a–k are designated as a 4-bit signal DELAY<0:3>.

Returning, now, to FIG. 2, the delay stages 42a–k are coupled to four serial encoder circuits 120a–d, each of which has 11 complementary inputs. The serial encoder circuits 120a–d are coupled to the delay stages 42a–k in staggered order so that, as the rising edge of the IN signal propagates to the four complementary outputs of each delay stage 42a–k, an input of each serial encoder circuit 120a–d transitions high in sequence. Thus, for example, the <0> inputs of the serial encoder circuit 120a transitions, followed by the <1> inputs of the serial encoder circuit 120b, followed by the <2> inputs of the serial encoder circuit 120c, followed by the <3> inputs to the serial encoder circuit 120d, followed by the <4> inputs to the serial encoder circuit 120a.

Figure 7:
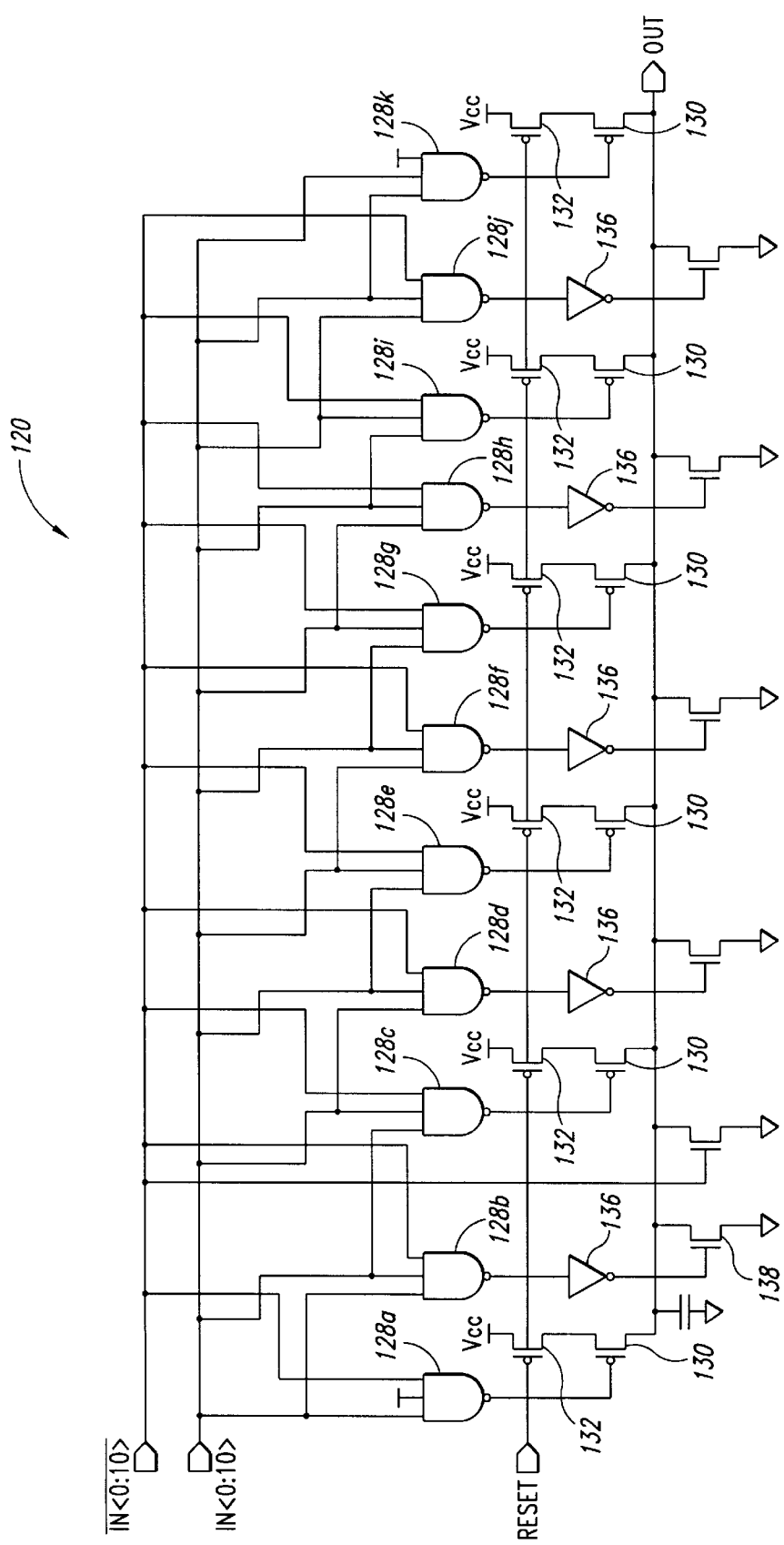
FIG. 7 is a logic and schematic diagram of one embodiment of a serial encoder circuit used in the clock speed sensing system of FIG. 2.

The serial encoder circuits 120a–d are shown in greater detail in FIG. 7. Each serial encoder circuit 120 includes 11 NAND gates 128a–k each of which receives a respective IN signal and, except for the NAND gate 128a, the IN signal applied to the "upstream" adjacent NAND gate 128a–j.

Except for the NAND gate 128k, each of the NAND gates 128a–j also receives the complementary IN* signal applied to the downstream adjacent NAND gate 128b–k. As explained above with reference to FIGS. 4 and 6, each of the IN signals applied to the serial encoder circuits 120 transitions high and its complement IN* transitions low when the IN signal applied to the first delay stage 42a (FIG. 2) propagates to the corresponding outputs of the delay stages 42a–k. Thus, each of the NAND gates 128a–k is sequentially enabled when its corresponding IN signal goes high. Each of the NAND gates 128a–k is then subsequently disabled when the complement of the IN input applied to the adjacent downstream NAND gate 128 transitions low. Thus, as the IN signal applied to the first delay stage 42a propagates through the delay stages 42a–k, an output of each NAND gate 128a–k transitions low in sequence. Alternate NAND gates 128a,c,e,g,i,k are coupled to the gate of a respective PMOS transistor 130, which is coupled to $V_{cc}$ through a PMOS reset transistor 132 and to the OUT line. As the output of each NAND gate 128a,c,e,g,i,k transitions low, its corresponding transistor 130 is turned ON thereby driving the OUT line high.

The remaining alternate NAND gates 128b,d,f,h,j are coupled through a respective invertor 136 to the gate of a respective NMOS transistor 138. As the output of each NAND gateb,d,f,h,j transitions low, its corresponding transistor 138 is turned ON, thereby driving the OUT line low. As a result, as the IN signal applied to the delay stage 142a is coupled through the delay stages 42a–k, the OUT line toggles high and then low.

Figure 8:
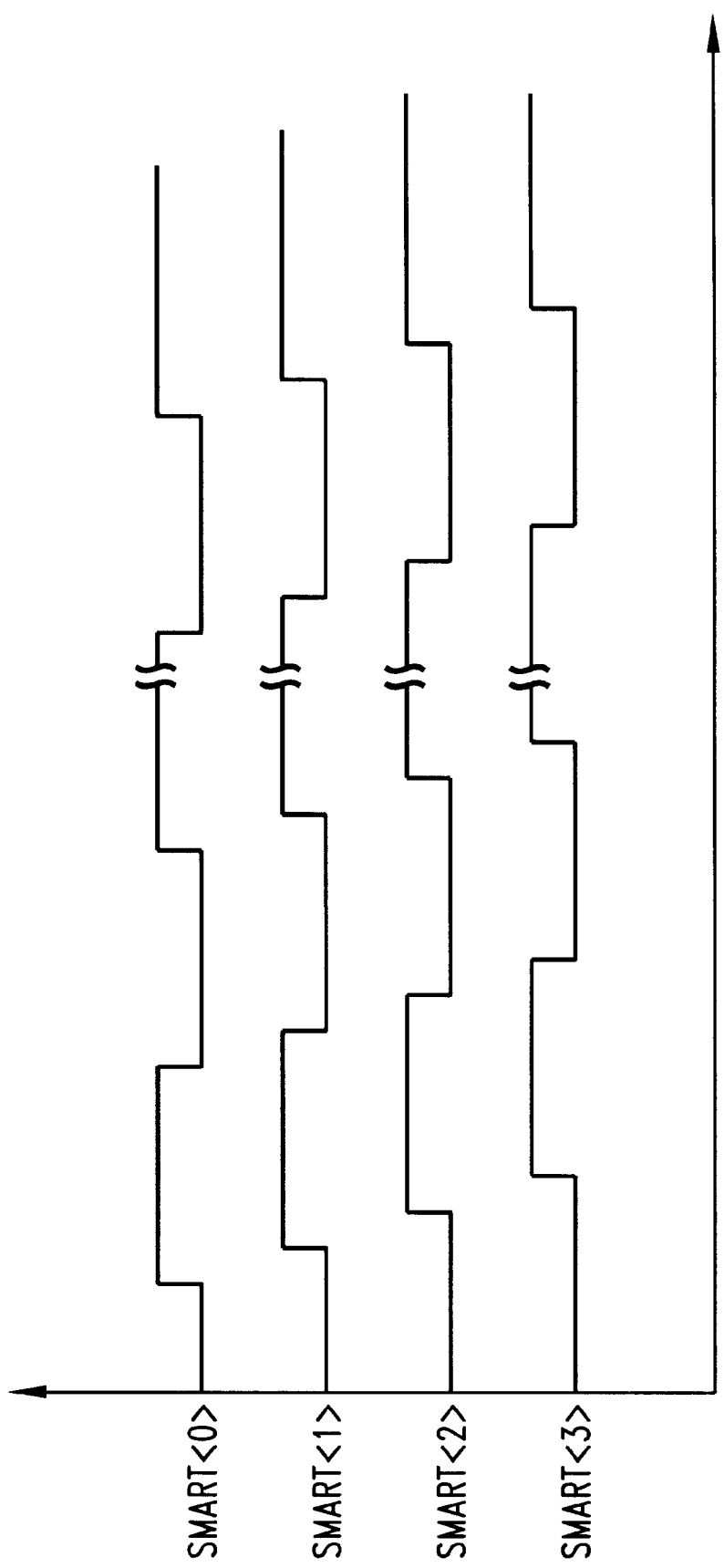
FIG. 8 is a timing diagram showing signals generated by the clock speed sensing system of FIG. 2.

Returning, now, to FIG. 2, it will be recalled that the outputs of the delay stages 42a–k are coupled to the serial encoder circuits 120a–d in a staggered manner. Thus, the SMART<0:3> outputs from the serial encoder circuits 120a–d comprise 4 periodic signals having phases of 0, 90, 180 and 270 degrees, respectively, as shown in FIG. 8. The number of transitions of the SMART<0:3> signals corresponds to the number of outputs of the delay stages 42a–k through which the IN signal propagates before the RESET signal is generated by the reset circuit 14 at the next CLK pulse. Thus, the number of transitions of the SMART <0:3> signals corresponds to the period of the CLK signal.

Figure 9:
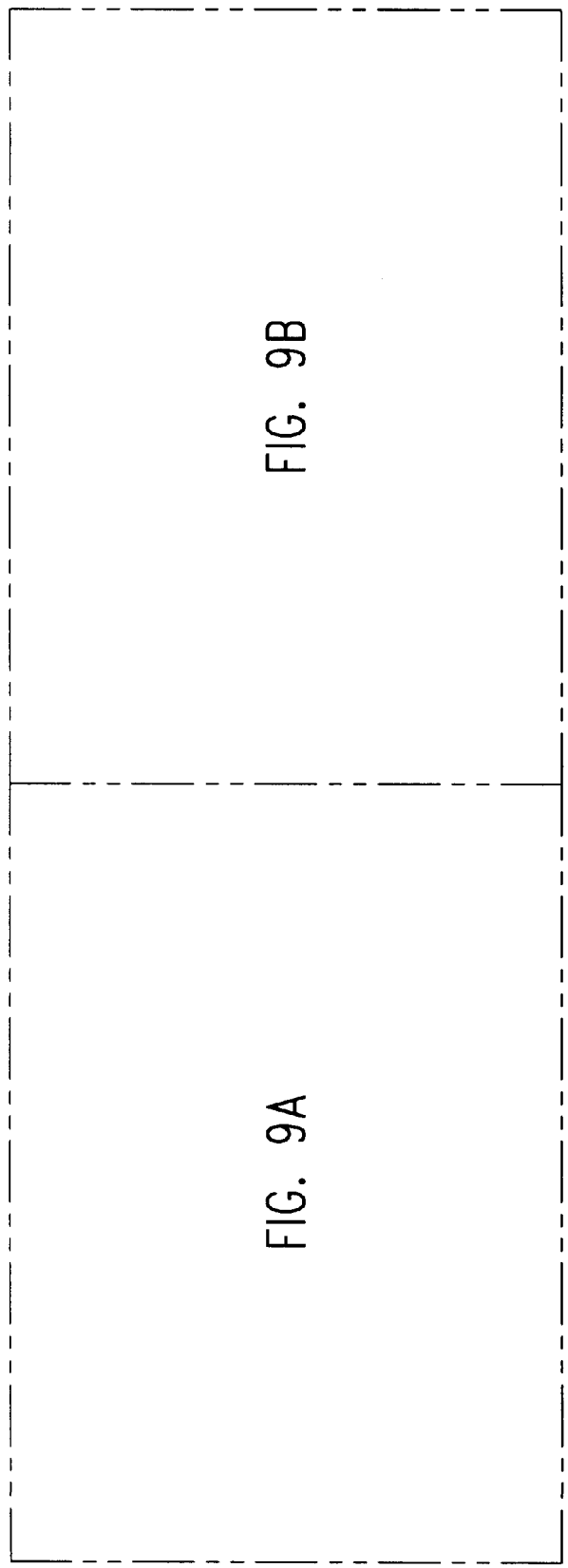
FIG. 9 is a logic diagram showing one embodiment of a delay circuit that may be used in the system of FIG. 1.
Figure 9A:
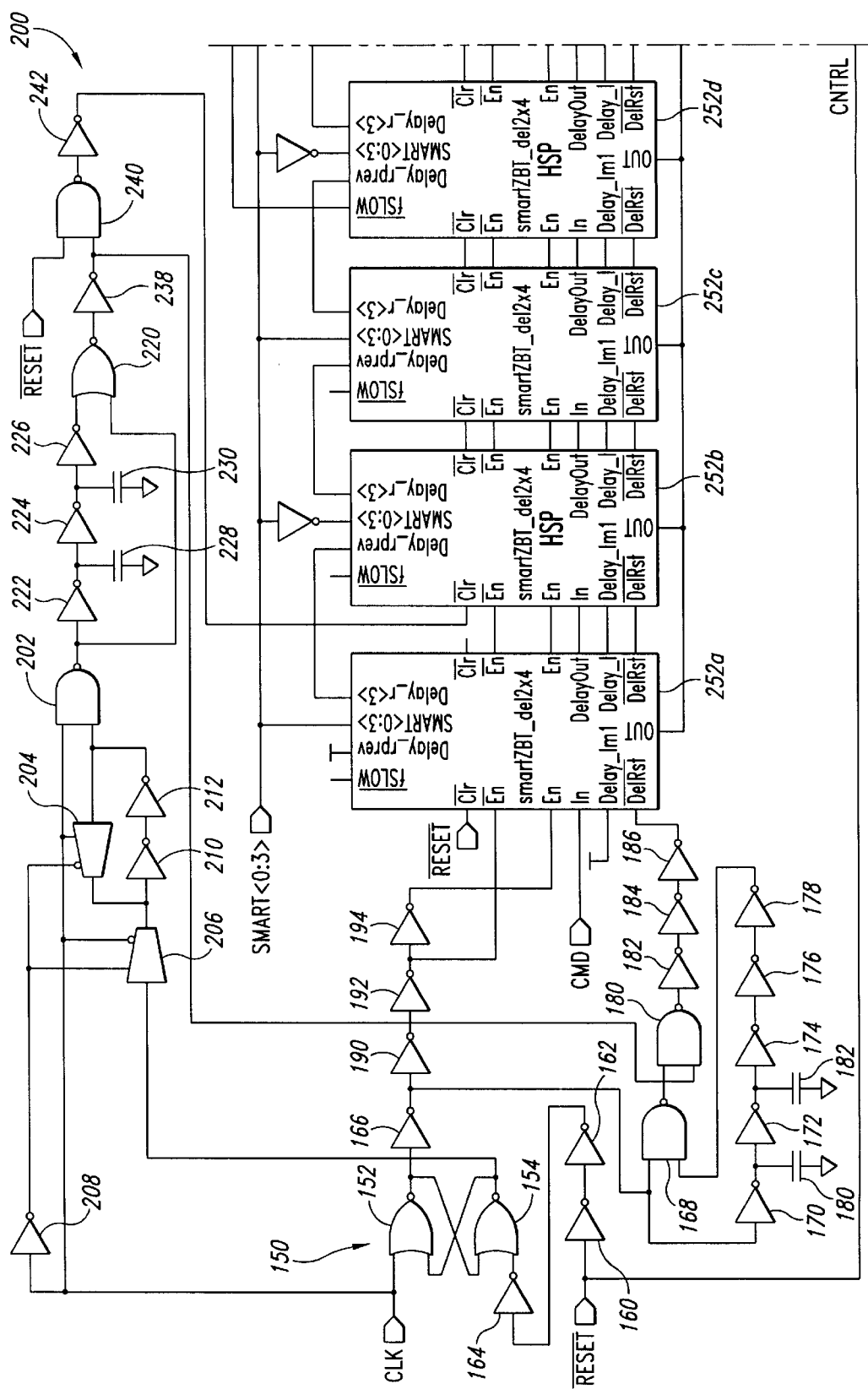
Figure 9B:
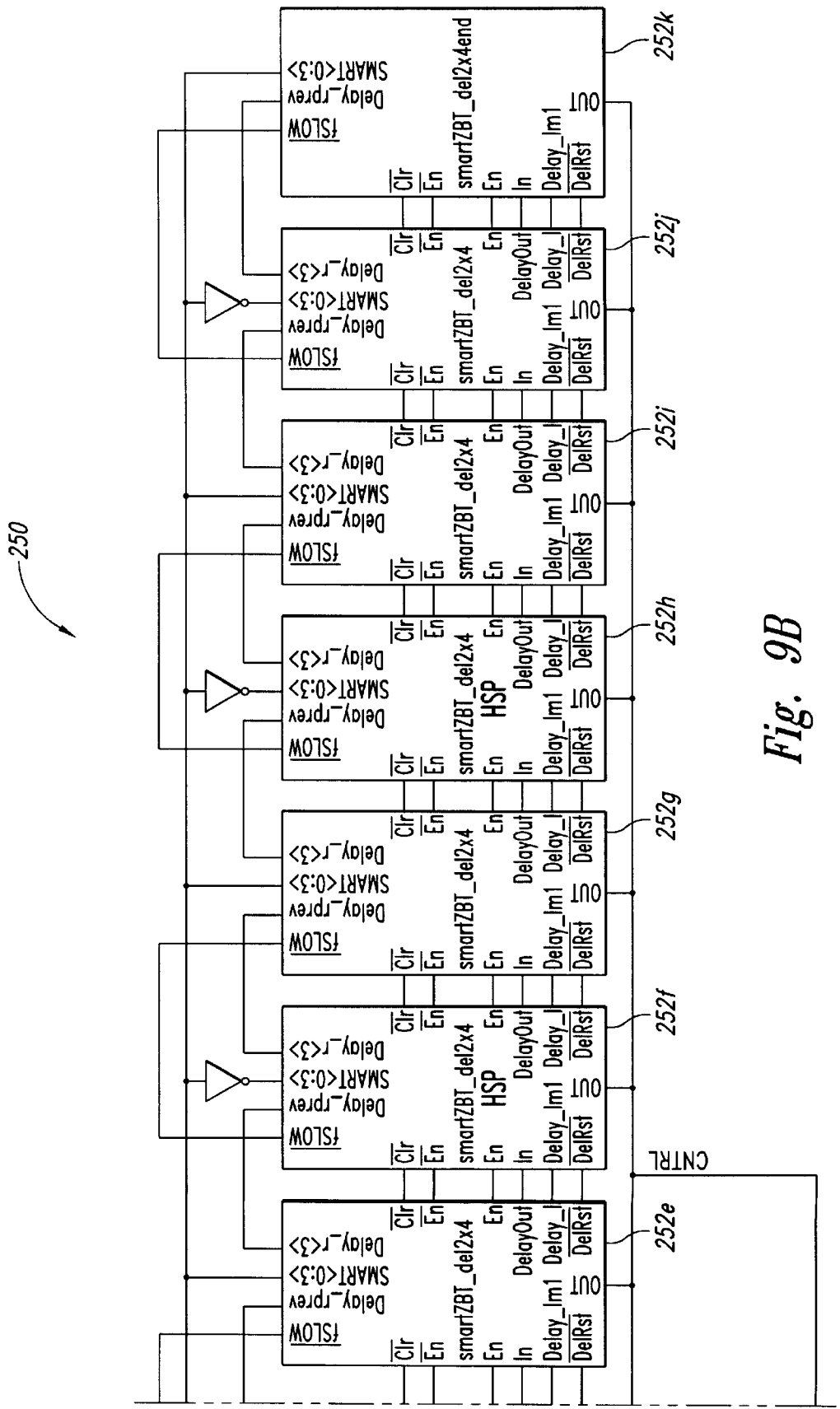

The SMART<0:3> signals correspond to the SPEED signal shown in FIG. 1, which, as explained above with reference to FIG. 1, are applied to a delay circuit 8. One embodiment of the delay circuit 8 is shown in greater detail in FIG. 9. The CLK signal is applied to a flip-flop 160 formed by a pair of the NOR gates 152, 154. Thus, on the leading edge of the CLK pulse, the flip-flop 150 is set. As explained in greater detail below, the flip-flop 150 is subsequently reset by a negative-going pulse coupled to the NOR gate 154 by three inverters 160, 162, 164. When the flip-flop 150 is set, it couples a high through an inverter 166 directly to one input of a NAND gate 168 and to the other input of the NAND gate 168 through a plurality of inverters 170–178. Two of the inverters 170, 172 drive respective capacitors 180, 182 so that transitions at the output of the inverter 178 are delayed relative to transitions at the output of the inverter 166. Before the flip-flop 150 has been set, the output of the NOR gate 152 is high, thereby causing the output of the inverter 178 to be high. Thus, the output of the NAND gate 168 transitions low responsive to the CLK pulse until the high at the output of the inverter 166 propagates through the inverters 171–178. The resulting pulse generated by the NAND gate 168 is coupled through a NAND gate 180 and three inverters 182–186 to produce an active low DelRst* pulse. As explained in greater detail below, the active low DelRst* resets circuitry at the start of each clock cycle.

When the flip-flop 150 is set, it also generates an inactive high EN* signal at and an inactive low EN signal through the inverter 166 and the inverters 190–194. As explained in greater detail below, the EN signals cause the delay circuit 8 (FIG. 1) to be set to the proper delay.

The CLK signal is also applied to a clearing circuit 200 that clears the delay to which the delay circuit 8 (FIG. 1) is set in the event of a reset occurring when the delayed CNTRL signal has been generated or responsive to the CLK pulse if the flip-flop 150 has been set. Accordingly, the CLK pulse is coupled directly to one input of a NAND gate 202 and to opposite control inputs of pass gate 204, 206, directly and through an inverter 208. Prior to the CLK pulse, the pass gate 206 is enabled to couple the output of the NOR gate 154 to the other input of the NAND gate 202 through a pair of inverters 210, 212. In response to the CLK pulse, the pass gate 206 is disabled and the pass gate 204 is enabled to latch the signal being applied to the input of the NAND gate 202 from the NOR gate 154. Thus, if the flip-flop 150 was set when the CLK pulse occurred, the NAND gate 202 generates a low that is coupled to a NOR gate 220. Prior to the output of the NAND gate 202 transitioning low, the high at the output of the NAND gate 202 is coupled as a low to the other input of the NOR gate 220 through three inverters 222, 224, 226. Two of the inverters 222, 224 drive respective capacitors 228, 230 so that the output of the inverter 226 remains low for period after the output of the NAND gate 202 transitions low. Thus, the NOR gate 220 outputs a high for a short period responsive to the CLK pulse if the flip-flop 150 was set when the CLK pulse occurred. The high from the NOR gate 220 is coupled through an inverter 238 to one input of a NAND gate 240, which is normally enabled by an inactive high RESET* signal. Thus, the NAND gate 240 outputs a high that causes an inverter 242 to generate an active low Clr* signal. The active low Clr* signal is also generated by the RESET* signal transitioning active low.

In summary, in response to each CLK pulse, an active low Clr* signal is generated if the flip-flop 150 remains set from the prior clock cycle, an active low En signal an inactive high En* signals are generated, and a delayed active low DelRst*signal is generated. When a command CNTRL signal is subsequently generated, the flip-flop 150 is reset.

The Clr*, En, En* and DelRst* are applied to a delay circuit 250 that includes a plurality of delay circuits 252a–k. The first delay circuit 252a receives a control command CMD signal, and the delay circuits 252a–k collectively generate the control CNTRL signal with a delay corresponding to the number of times that the SMART<0:3> signals toggle, as explained in greater detail below.

Figure 10:
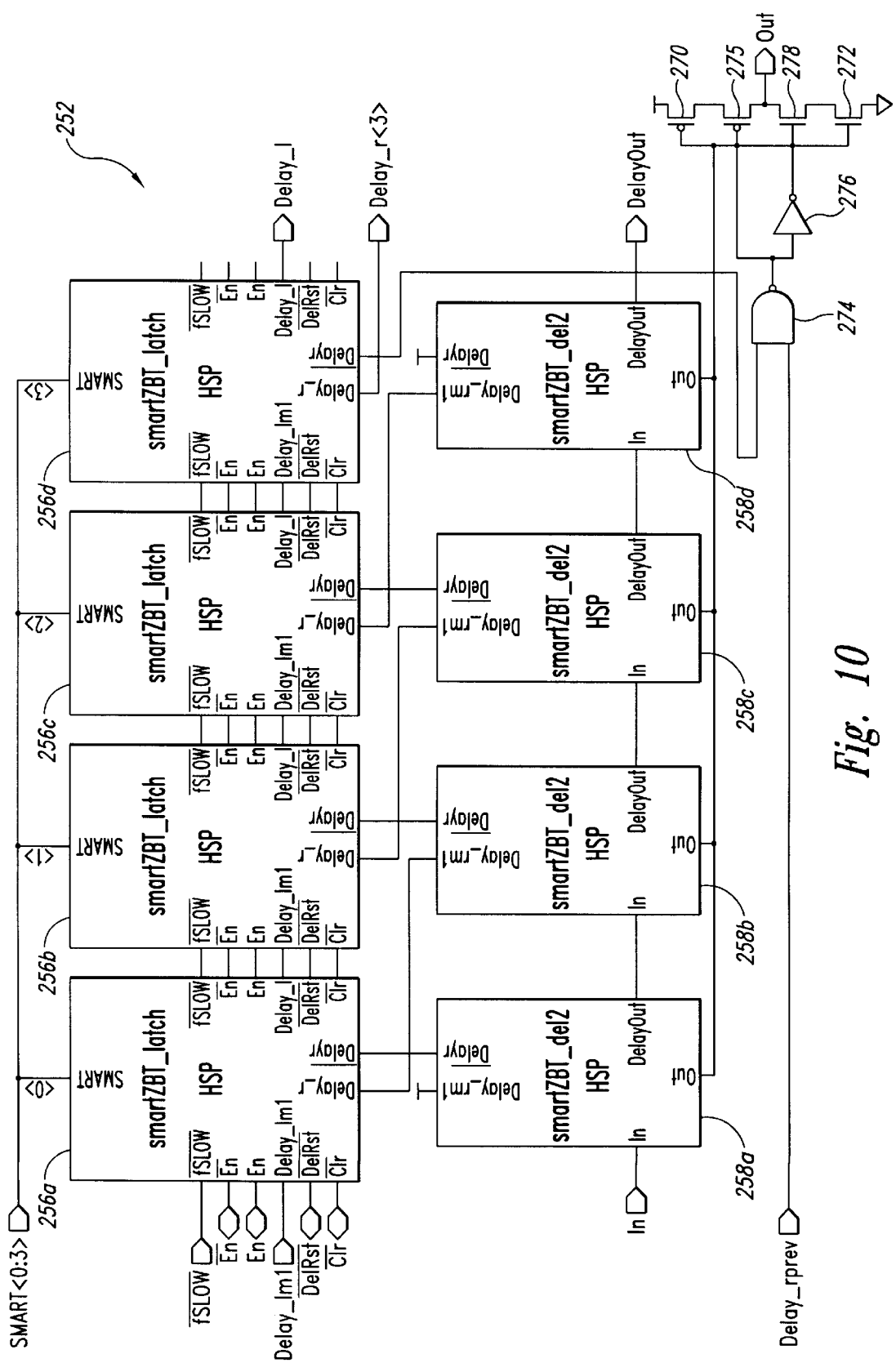
FIG. 10 is a logic diagram showing delay enable circuits and delay stages that may be used in the delay circuit of FIG. 9.

The delay circuits 252a–k are shown in FIG. 10. Each of the delay circuits 252 includes four delay enable circuits 256a–d. The delay enable circuits 256a–d, in turn, control respective delay stages 258a–d. As explained in greater detail below, the delay enable circuits 256a–d are sequentially enabled responsive to each transition of the SMART<0:3> signals. Note, however, from FIG. 9 that alternate delay circuits 252a,c,e,g,i,j are enabled by the SMART<0:3> signals while the remaining delay circuits 252b,d,f,h,j are enabled through inverters 257 by the compliment of the SMART<0:3> signals. From an examination of the SMART<0:3> signals shown in FIG. 8, it will be apparent that the delay enable circuits 256a–d are enabled in sequence. When each of the delay enable circuits 256a–d is enabled, it outputs a high Delay_I signal that enables the adjacent delay enable circuit 256b–d, or, in the case of the fourth delay enable circuit, 256d, the first delay enable circuit 256a in the downstream adjacent delay circuit 252b–k.

When each of the delay enable circuits 256a–d is enabled, it generates a high Delay_r signal that enables its respective downstream adjacent delay stage 258a–d to produce an output signal. When each of the delay enable circuits 256a–d is enabled, it also generates a low Delayr* signal that disables its respective delay circuits from generating an output signal. The output signals from the delay stage 258a–d are coupled to respective gates of a PMOS transistor 270 and an NMOS transistor 272, which function as a switched inverter. The inverter is switched ON by the Delay_r signal from the last delay stage 258d in the upstream delay circuit 252 being high indicative of the delay stage 258d being enabled and the Delayr* signal from the delay stage 258d in the same delay circuit 252 being high indicative of the delay stage 258 having not yet been enabled. When both Delayr* and Delay_r are high, the output of a NAND gate 274 is low, thereby turning ON a PMOS transistor 275 and causing an inverter 276 to output a high that turns ON an NMOS transistor 278. In this manner, the delay stages 258a–d and all of the delay circuits 252a–k are effectively connected in series with each other.

Figure 11:
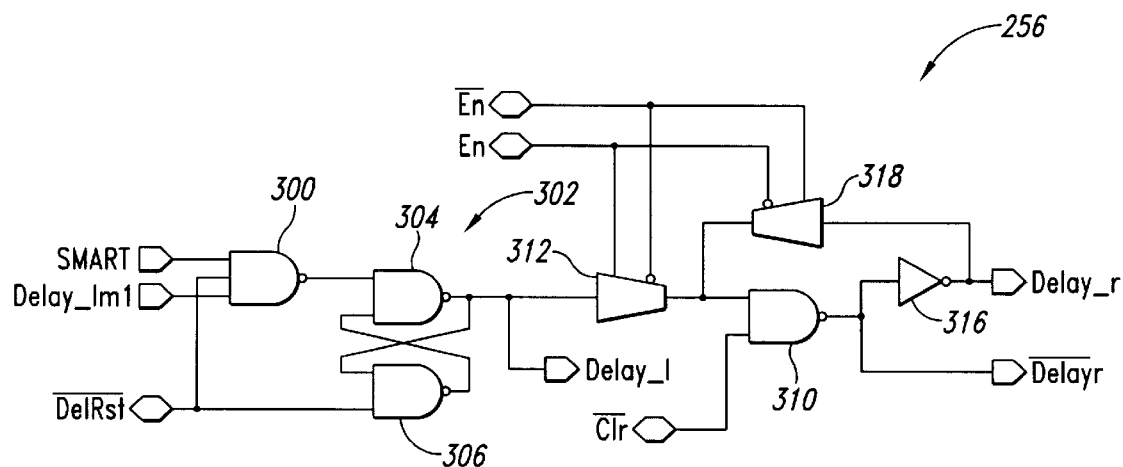
FIG. 11 is a logic diagram showing one embodiment of the delay enable circuits of FIG. 10.

The delay enable circuits 256 are shown in greater detail in FIG. 11. Each delay enable circuit 256 includes a NAND gate 300 that is enabled by a high Delay_Im1 signal from an enabled downstream adjacent delay enable circuit 256 and an inactive high DelRst*, which is generated as explained above with reference to FIG. 9. The DelRst* signal is coupled to the NAND gate 300 in all of the delay enable circuits 256. When the NAND gate 300 is enabled, it outputs a low responsive to the rising edge of its respective SMART signal, thereby setting the flip-flop 302 formed by a pair of NAND gates 304, 306. The NAND gate 304 then outputs a high DelayJ signal, which, as explained above, is applied to the NAND gate 300 of the downstream adjacent delay enable circuit 256. The high at the output of the NAND gate 304 is also coupled to the input of a NAND gate 310 through a pass gate 312. As explained above with reference to FIG. 9, the Clr* is set inactive high responsive to the CLK pulse, thereby enabling the NAND gate 310.

The EN signal is set active high and the EN*signal is set active low when a CNTRL signal is generated during a prior clock cycle so that the high at the output of the NAND gate 304 is coupled to the NAND gate 310. The NAND gate 310 then generates an active low Delayr* signal and an active high Delay_r signal from an inverter 316. The CLK pulse at the start of the current clock cycle causes the EN signal to be set inactive low and the EN* signal to be set inactive high. The output of the inverter 316 is then coupled through a pass gate 318 to the input of the NAND gate 310, and the input of the NAND gate 310 is isolated from the output of the NAND gate 304, thereby latching the state of the Delay_r and Delayr* signals. As explained above, the active low Delayr* signal disables the corresponding delay stage 258 while the active high Delay_r signal enables the downstream adjacent delay stage 258.

Figure 12:
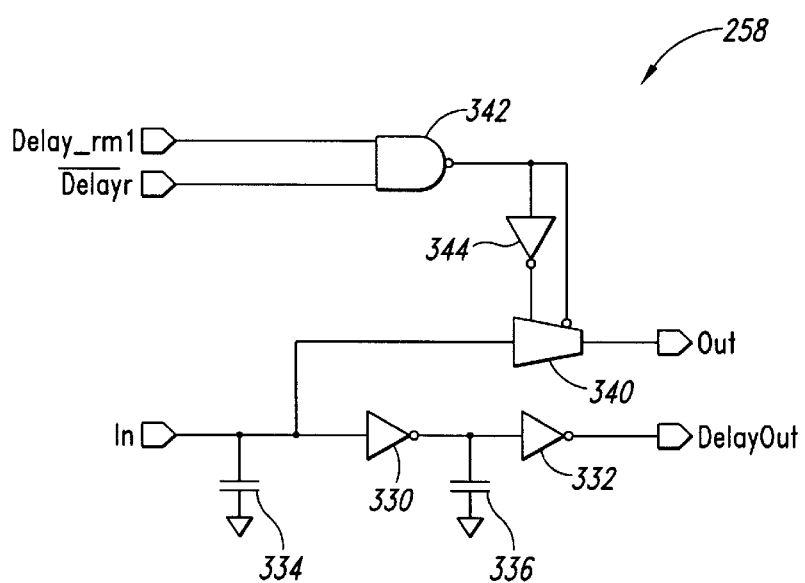
FIG. 12 is a logic diagram of one embodiment of the delay stages of FIG. 10.

One embodiment of the delay stages 258a–d (FIG. 10) is shown in FIG. 12. Each of the delay stages 258 includes a pair of inverters 330, 332 and a pair of capacitors 334, 336 coupled to the input of the inverters 330, 332, respectively. The inverter 332 generates a DelayOut signal having transitions delayed in time from transitions of an In signal applied to the input of the inverter 330. The delay stages 258 of all of the delay circuits 252a–k (FIG. 9) are connected in series with each other so that the CMD signal coupled to the input of the first delay circuit 252a propagates sequentially through the inverters 330, 332 in all of the delay circuits 252a–k. However, the output of the inverter 332 in an adjacent upstream delay circuit 252 is coupled to generate the CMD signal only if a pass gate 340 is conductive. The pass gate 340 is conductive responsive to a NAND gate 342 outputing a low, thereby causing an inverter 344 to output a high responsive to the Delay_rm1 signals and the Delayr* signals being high. As explained above, these signals are high only when the upstream adjacent delay enable circuit 256a–d is enabled. When its respective delay enable circuit 256 is enabled, the Delayr* signal from its respective delay enable circuit 256 transitions low, making the pass gate 340 nonconductive. Thus, the delay stages 258 are each enabled in sequence, but only one delay stage 258 is enabled at a time. In response to the CLK pulse, the Delay_r signal from a single delay enable circuit 256 is a latched high, thereby causing the pass gate 340 in only the downstream adjacent delay stage 258 to be conductive. When the CMD signal is applied to the first delay circuit 252a during the next clock cycle, the delay circuit containing the conductive pass gate 340 will generate the CNTRL signal.

In summary, the SMART<0:3> signals toggle a plurality of times during a first clock cycle responsive to a first CLK pulse, and the number of times that the SMART<0:3> signals toggle determines which one of the delay enable circuits 256 will be enabled. The enabled delay enable circuit 256 then enables the pass gate 340 in the downstream adjacent delay stage 258 to generate the CNTRL signal from the CMD signal. Significantly, the pass gate 340 in the selected delay stage 258 is enabled during the very next CLK cycle from which the proper delay was determined.

Figure 13:
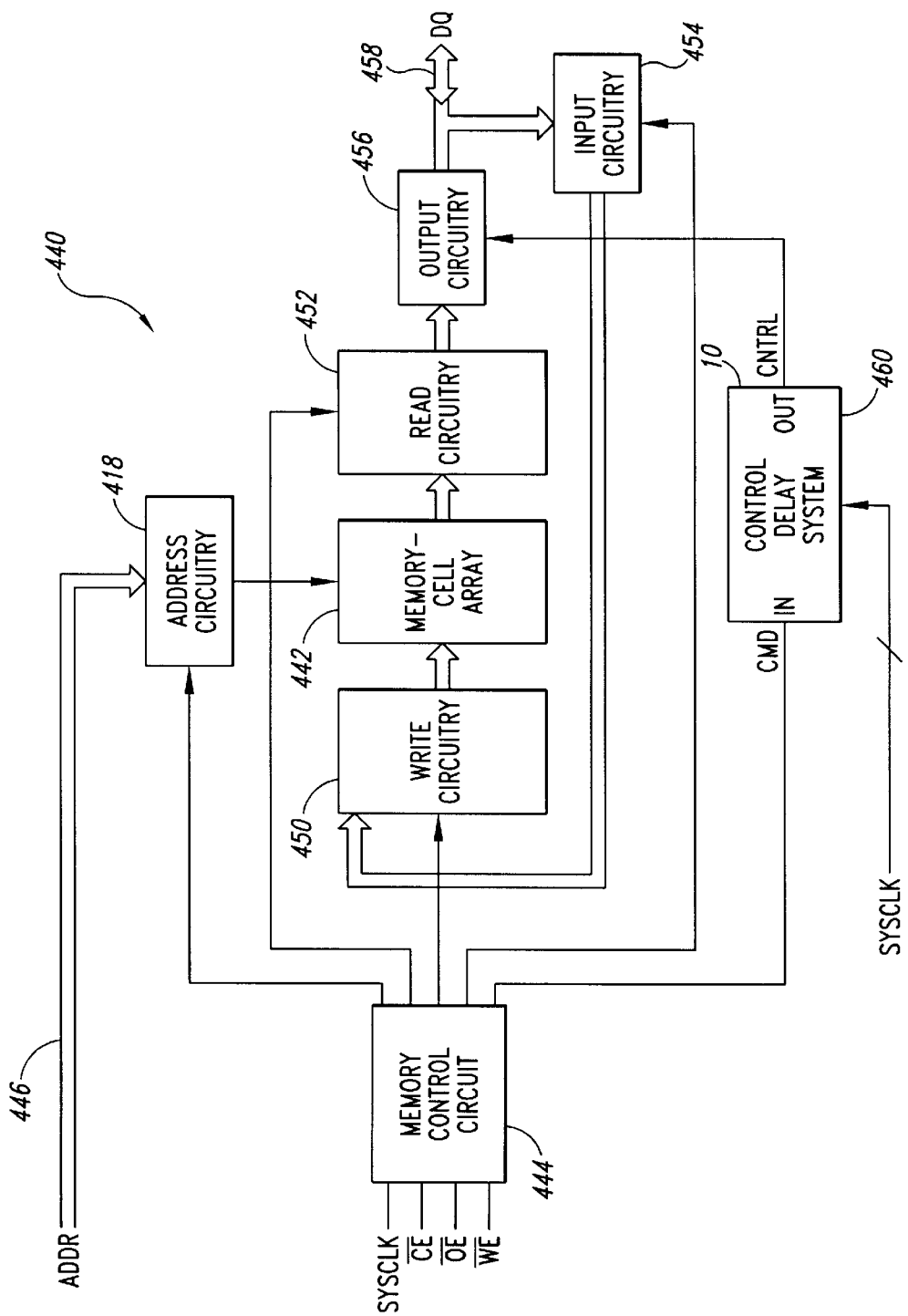
FIG. 13 is a functional block circuit diagram depicting a memory device using an adaptive control system according to one embodiment of the invention.

FIG. 13 depicts a memory device 440 that may use the above-described embodiment of a system for adaptively adjusting control signal timing. With reference to FIG. 13, a memory cell array 442 operates in accordance with a plurality of internal control signals produced by a memory control circuit 404. A device external to the memory device 440 applies a plurality of command signals to the memory control circuit 444, including well-known signals such as write-enable ($\overline{WE}$), output enable ($\overline{OE}$), chip enable ($\overline{CE}$). The memory control circuit 444 also receives the system clock signal SYSCLK. Those skilled in the art will understand that each of the depicted control signals may itself represent a plurality of associated control signals, and that additional well-known control signals may be included depending on the particular type of memory device 440 (whether an SRAM, synchronous DRAM, etc.).

An address ADDR is applied to the memory device 440 on an address bus 446. The address ADDR may be a single applied address, as in the case of an SRAM, or maybe a time-multiplexed address, as in the case of a DRAM. In response to one or more control signals provided by the memory control circuit 444, address circuitry 448 decodes the address ADDR, selects corresponding locations within the memory cell array 442, and initiates access to these locations. As is known to those skilled in the art, the depicted address circuitry 448 includes a variety of functional components particular to the memory device type. For example, the address circuitry 448 might include address burst counter and multiplexer circuitry, together with activation and address select circuitry appropriate to the particular memory device type.

In response to one or more control signals provided by the memory control circuit 444, write circuitry 450 writes data to addressed locations within the memory cell array 442. Those skilled in the art know that the depicted write circuitry 450 includes a variety of functional components particular to the memory device type. For example, the write circuitry 450 might include byte enable circuitry and write driver circuitry. In response to one or more control signals provided by the memory control circuit 444, read circuitry 452 retrieves data stored in the address locations within the memory cell array 442. Those skilled in the art know that the depicted read circuitry 452 includes a variety of functional circuit components particular to the memory device type. For example, the read circuitry 452 might include sense amplifier circuitry and I/O gating circuitry.

In response to one or more control signals provided by the memory control circuit 444, data input and data output circuits 454 and 456 are selectively connected to a data bus 458 to input and output data D and Q to and from the memory device 440, all respectively. The data input circuitry 454 receives data from the data bus 458 and provides it to the write circuitry 450 for storage in an addressed location of the memory cell array 442. The data output circuitry 456 receives data retrieved by the read circuitry 452 and provides this data to external devices via the data bus 458. Those skilled in the art know that the depicted data input and out circuits 454 and 456 may include a variety of functional circuit components, such as buffering and register circuitry.

In accordance with an embodiment of the present invention, an embodiment of a system 10 for adaptively adjusting control signal timing 460 is included within the memory device 440. In the particular depiction of FIG. 13, the system 10 for adaptively adjusting control signal timing 460 receives one or more CMD signals from the memory control circuit 444 and applies one or more CNTRL signals to the data output circuit 456. The system 10 for adaptively adjusting control signal timing 460 adjusts the time delay of the CNTRL signal as a function of the frequency of the SYSCLK signal. As one example, the timing of data transfer from the read circuitry 452 to the data output circuitry 456 may be controlled by adjusting the timing of the internally generated data clock signal that clocks read data into the output circuitry. As another example, the system 10 may selectively adjust the timing of the internally generated output enable signal applied to the data output circuitry 456, to selectively control the timing of the low impedance connection to the data bus 458. Of course, those skilled in the art will appreciate that the system 10 may be used to adjust timing of a wide variety of control signals within the memory device 440, and not just those associated with the depicted data output circuitry 456.

Figure 14:
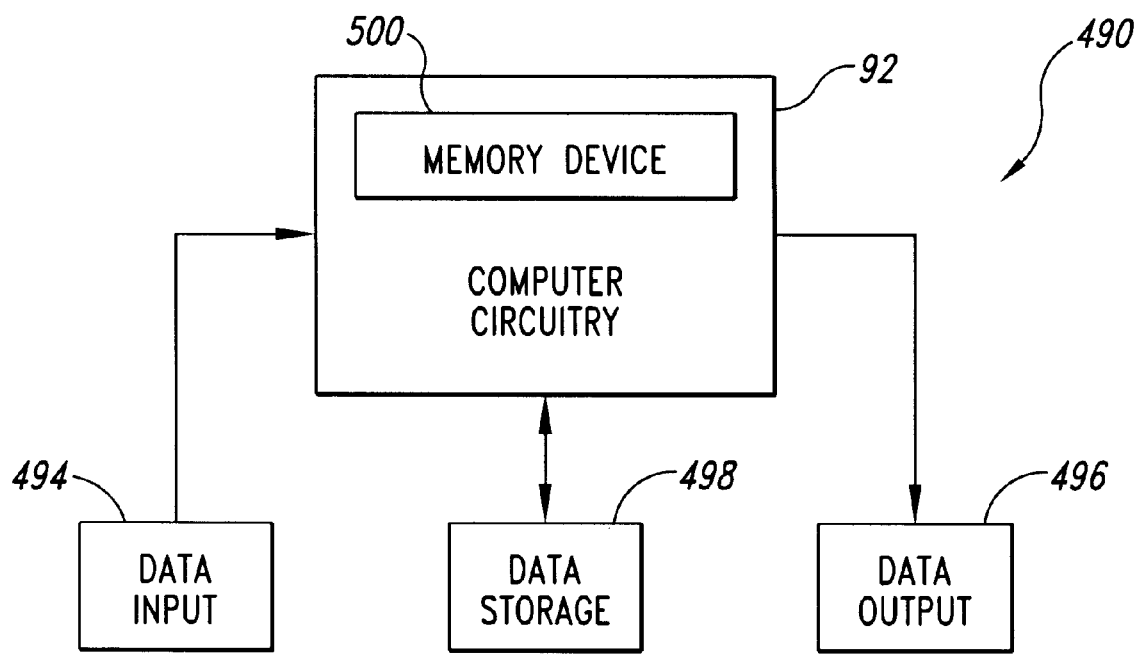
FIG. 14 is a functional block diagram depicting a computer system using one or more of the memory devices of FIG. 13.

FIG. 14 is a functional block diagram depicting a computer system 490 which includes a memory device 500 constructed in accordance with an embodiment of the present invention. For example, the memory device 500 could be of configuration similar to the memory device 440 and equivalents described above in connection with FIG. 13. The computer system 490 includes computer circuitry 492 for performing such functions as executing software to accomplish desired calculations and tasks. The computer circuitry 492 includes at least one processor (not shown) and the memory device 500, as shown. A data input device 494 is coupled to the computer circuitry 492 to allow an operator to manually input data thereto. Examples of data input devices 494 include a keyboard and a pointing device. A data output device 496 is coupled to the computer circuitry 492 to provide data generated by the computer circuitry to the operator. Examples of data output devices 496 include a printer and a video display unit. A data storage device 498 is coupled to the computer circuitry 492 to store data and/or retrieve data from external storage media. Examples of storage devices 498 and associated storage media include drives that accept hard and floppy disks, magnetic tape recorders, and compact-disc read-only memory (CD-ROM) drives.

It will be appreciated that, although specific embodiments of the present invention have been described above for purposes of illustration, various modifications may be made without deviating from the spirit and scope of the invention. Accordingly, the invention is not limited by the disclosed embodiments, but instead the scope of the invention is determined by the following claims.

What is claimed is:

1. A control signal timing circuit for use in an integrated circuit that is adapted to receive a clock signal and to perform internal operations responsive to a control signal, the control signal timing circuit comprising:

clock sensing circuitry operable to receive the clock signal and to responsively produce at least one speed signal having a number of transitions over a fixed period that is indicative of the frequency of the clock signal; and a control signal delay circuit coupled to receive a command signal and the speed signal, the control signal timing circuitry responsively producing a delayed control signal that is time-delayed relative to the command signal by a time-delay value corresponding to the number of transitions of the at least one speed signal.

2. The control signal timing circuit of claim 1 wherein the clock sensing circuitry comprises:

a plurality of serially connected delay stages the first of which is coupled to receive an input signal responsive to the clock signal, the input signal propagating through the delay stages for a fixed period of time, each of the delay stages generating an output signal that transitions as the input signal propagates thereto; and a serial encoder circuit coupled to receive the output signals from the delay stages, the serial encoder being operable to generate the at least one speed signal and cause the at least one speed signal to transition responsive to each transition of the output signals from the delay stages.

3. The control signal timing circuit of claim 2 wherein each of the delay stages comprise:

a plurality of series connected delay circuits through which the input signal propagates, each of the delay circuits generating an output signal as the input signal propagates thereto; and a plurality of series connected latches corresponding in number to the number of delay circuits, each of the latches being coupled to a respective delay circuit and generating an output signal that transitions responsive to receiving an output signal from the respective delay circuit.

4. The control signal timing circuit of claim 2 wherein the input signal propagates through the delay stages for a period of time defined by an enable signal, and wherein the clock sensing circuitry further comprises a fixed delay circuit coupled to receive a signal responsive to the clock signal and being operable to generate the enable signal for a fixed period of time after the delay circuit receives the signal responsive to the clock signal.

5. The control signal timing circuit of claim 2 wherein the serial encoder circuit comprises:

a plurality of logic circuits coupled to the delay stages, the logic circuits corresponding in number to the number of delay stages, each of the logic circuits generating an output responsive to a transition of the output signal from a respective delay stage; and a switching circuit that is structured to cause an output terminal to switch between two logic levels as each logic circuit generates a respective output.

6. The control signal timing circuit of claim 1 wherein the control signal delay circuit comprises a plurality of series connected delay circuits coupled to receive the at least one speed signal, the first of the delay circuits in the series being coupled to receive the command signal, the delay circuits being operable to allow the command signal to propagate thereto with a delay, the delay circuits being operable to generate the control signal when the command signal has propagated to an enabled delay circuit, one of the delay circuits corresponding to the number of transitions of the at least one speed signal being enabled to generate the control signal.

7. The control signal timing circuit of claim 6 wherein each of the delay circuits comprises:

a plurality of series connected delay enable circuits coupled to receive the at least one speed signal, each of the delay enable circuits in the series being sequentially enabled by a respective transition of the at least one speed signal to generate a delay enable signal; and a plurality of series connected delay stages corresponding in number to the number of delay enable circuits, each of the delay stages being coupled to receive a delay enable signal from a respective delay enable circuit, the first of the delay stages receiving the command signal so that the command signal sequentially propagates through the delay stages, an enabled one of the delay stages generating the control signal as the command signal propagates thereto, the delay stages being enabled responsive to the delay enable signal from the respective delay enable circuit.

8. The control signal timing circuit of claim 7 wherein each of the delay enable circuits comprise a latch operable to be set by each transition of the at least one speed signal when the latch is enabled, the latches in each of the series connected delay enable circuits being coupled to enable the latch in an adjacent delay enable circuit when each latch is enabled, each latch, when enabled, generating a respective one of the delay enable signals.

9. A clock sensing circuit, comprising:

a plurality of serially connected delay stages the first of which is coupled to receive an input signal responsive to the clock signal, the input signal propagating through the delay stages for a fixed period of time, each of the delay stages generating an output signal that transitions as the input signal propagates thereto; and a plurality of series connected latches corresponding in number to the number of delay circuits, each of the latches being coupled to a respective delay circuit and generating an output signal that transitions responsive to receiving an output signal from the respective delay circuit.

10. A memory device operable to transfer data to and from a device external to the memory device, the memory device receiving a clock signal controlling timing of data transfer operations, the memory device comprising:

a memory array operable to store data;

a data input circuit operable to receive data from the external device;

a data output circuit operable to provide data to the external device;

an array access circuit coupled with the memory array and with the data input and output circuits, the array access circuit operable to transfer data from the data input circuit to the memory array for storage therein, the array access circuit further operable to transfer data stored in the memory array to the data output circuit;

a memory control circuit operable to produce at least one control signal applied to one of the array access circuit, data input, and data output circuits to control operation thereof;

clock sensing circuitry operable to receive the clock signal and to responsively produce at least one speed signal having a number of transitions over a fixed period that is indicative of the frequency of the clock signal; and a control signal delay circuit coupled to receive a command signal and the speed signal, the control signal timing circuitry responsively producing a delayed control signal that is time-delayed relative to the command signal by a time-delay value corresponding to the number of transitions of the at least one speed signal.

11. The memory device of claim 10 wherein the clock sensing circuitry comprises:

a plurality of serially connected delay stages the first of which is coupled to receive an input signal responsive to the clock signal, the input signal propagating through the delay stages for a fixed period of time, each of the delay stages generating an output signal that transitions as the input signal propagates thereto; and a serial encoder circuit coupled to receive the output signals from the delay stages, the serial encoder being operable to generate the at least one speed signal and cause the at least one speed signal to transition responsive to each transition of the output signals from the delay stages.

12. The memory device of claim 11 wherein each of the delay stages comprise:

a plurality of series connected delay circuits through which the input signal propagates, each of the delay circuits generating an output signal as the input signal propagates thereto; and a plurality of series connected latches corresponding in number to the number of delay circuits, each of the latches being coupled to a respective delay circuit and generating an output signal that transitions responsive to receiving an output signal from the respective delay circuit.

13. The memory device of claim 11 wherein the input signal propagates through the delay stages for a period of time defined by an enable signal, and wherein the clock sensing circuitry further comprises a fixed delay circuit coupled to receive a signal responsive to the clock signal and being operable to generate the enable signal for a fixed period of time after the delay circuit receives the signal responsive to the clock signal.

14. The memory device of claim 11 wherein the serial encoder circuit comprises:

a plurality of logic circuits coupled to the delay stages, the logic circuits corresponding in number to the number of delay stages, each of the logic circuits generating an output responsive to a transition of the output signal from a respective delay stage; and a switching circuit that is structured to cause an output terminal to switch between two logic levels as each logic circuit generates a respective output.

15. The memory device of claim 10 wherein the control signal delay circuit comprises a plurality of series connected delay circuits coupled to receive the at least one speed signal, the first of the delay circuits in the series being coupled to receive the command signal, the delay circuits being operable to allow the command signal to propagate thereto with a delay, the delay circuits being operable to generate the control signal when the command signal has propagated to an enabled delay circuit, one of the delay circuits corresponding to the number of transitions of the at least one speed signal being enabled to generate the control signal.

16. The memory device of claim 15 wherein each of the delay circuits comprises:
   a plurality of series connected delay enable circuits coupled to receive the at least one speed signal, each of the delay enable circuits in the series being sequentially enabled by a respective transition of the at least one speed signal to generate a delay enable signal; and
   a plurality of series connected delay stages corresponding in number to the number of delay enable circuits, each of the delay stages being coupled to receive a delay enable signal from a respective delay enable circuit, the first of the delay stages receiving the command signal so that the command signal sequentially propagates through the delay stages, an enabled one of the delay stages generating the control signal as the command signal propagates thereto, the delay stages being enabled responsive to the delay enable signal from the respective delay enable circuit.

17. The memory device of claim 16 wherein each of the delay enable circuits comprise a latch operable to be set by each transition of the at least one speed signal when the latch is enabled, the latches in each of the series connected delay enable circuits being coupled to enable the latch in an adjacent delay enable circuit when each latch is enabled, each latch, when enabled, generating a respective one of the delay enable signals.

18. A computer system, comprising:
   a data input device;
   a data output device;
   computer circuitry coupled with the data input and data output devices;
   a memory device receiving a clock signal and being coupled to the computer circuitry, the memory device comprising:
      a memory array operable to store data;
      a data input circuit operable to receive data from the external device;
      a data output circuit operable to provide data to the external device;
      an array access circuit coupled with the memory array and with the data input and output circuits, the array access circuit operable to transfer data from the data input circuit to the memory array for storage therein, the array access circuit further operable to transfer data stored in the memory array to the data output circuit;
      a memory control circuit operable to produce at least one control signal applied to one of the array access circuit, data input, and data output circuits to control operation thereof;
      clock sensing circuitry operable to receive the clock signal and to responsively produce at least one speed signal having a number of transitions over a fixed period that is indicative of the frequency of the clock signal; and
      a control signal delay circuit coupled to receive a command signal and the speed signal, the control signal timing circuitry responsively producing a delayed control signal that is time-delayed relative to the command signal by a time-delay value corresponding to the number of transitions of the at least one speed signal.

19. The computer system of claim 18 wherein the clock sensing circuitry comprises:
   a plurality of serially connected delay stages the first of which is coupled to receive an input signal responsive to the clock signal, the input signal propagating through the delay stages for a fixed period of time, each of the delay stages generating an output signal that transitions as the input signal propagates thereto; and
   a serial encoder circuit coupled to receive the output signals from the delay stages, the serial encoder being operable to generate the at least one speed signal and cause the at least one speed signal to transition responsive to each transition of the output signals from the delay stages.

20. The computer system of claim 19 wherein each of the delay stages comprise:
   a plurality of series connected delay circuits through which the input signal propagates, each of the delay circuits generating an output signal as the input signal propagates thereto; and
   a plurality of series connected latches corresponding in number to the number of delay circuits, each of the latches being coupled to a respective delay circuit and generating an output signal that transitions responsive to receiving an output signal from the respective delay circuit.

21. The computer system of claim 19 wherein the input signal propagates through the delay stages for a period of time defined by an enable signal, and wherein the clock sensing circuitry further comprises a fixed delay circuit coupled to receive a signal responsive to the clock signal and being operable to generate the enable signal for a fixed period of time after the delay circuit receives the signal responsive to the clock signal.

22. The computer system of claim 19 wherein the serial encoder circuit comprises:
   a plurality of logic circuits coupled to the delay stages, the logic circuits corresponding in number to the number of delay stages, each of the logic circuits generating an output responsive to a transition of the output signal from a respective delay stage; and
   a switching circuit that is structured to cause an output terminal to switch between two logic levels as each logic circuit generates a respective output.

23. The computer system of claim 18 wherein the control signal delay circuit comprises a plurality of series connected delay circuits coupled to receive the at least one speed signal, the first of the delay circuits in the series being coupled to receive the command signal, the delay circuits being operable to allow the command signal to propagate thereto with a delay, the delay circuits being operable to generate the control signal when the command signal has propagated to an enabled delay circuit, one of the delay circuits corresponding to the number of transitions of the at least one speed signal being enabled to generate the control signal.

24. The computer system of claim 23 wherein each of the delay circuits comprises:
   a plurality of series connected delay enable circuits coupled to receive the at least one speed signal, each of the delay enable circuits in the series being sequentially enabled by a respective transition of the at least one speed signal to generate a delay enable signal; and
   a plurality of series connected delay stages corresponding in number to the number of delay enable circuits, each of the delay stages being coupled to receive a delay enable signal from a respective delay enable circuit, the first of the delay stages receiving the command signal so that the command signal sequentially propagates through the delay stages, an enabled one of the delay stages generating the control signal as the command signal propagates thereto, the delay stages being enabled responsive to the delay enable signal from the respective delay enable circuit.

25. The computer system of claim 24 wherein each of the delay enable circuits comprise a latch operable to be set by each transition of the at least one speed signal when the latch is enabled, the latches in each of the series connected delay enable circuits being coupled to enable the latch in an adjacent delay enable circuit when each latch is enabled, each latch, when enabled, generating a respective one of the delay enable signals.

26. A method of sensing the frequency of a periodic clock signal, comprising:

generating an input signal responsive to the clock signal;

applying the input signal to a delay line; and generating a plurality of first output signals for a predetermined period as the input signal propagates through the delay line, the number of first output signals being generated being indicative of the frequency of the clock signal.

27. The method of claim 26 further comprising changing the state of a second output signal responsive to each of the first output signals so that the number of transitions correspond to the frequency of the clock signal.

28. In a memory device operating in synchronism with a periodic clock signal, the memory device receiving a memory command signal and producing a corresponding control signal to perform a respective operation in the memory device, a method of controlling the timing of the control signal, comprising:

determining the frequency of the clock signal during a first period of the clock signal; and generating the control signal during a second period of the clock signal immediately following the first clock period, the control signal being generated responsive to the command signal at a time delayed from the command signal corresponding to the determined frequency of the clock signal.

29. The method of claim 28 wherein the act of determining the frequency of the clock signal comprises:

generating an input signal responsive to the clock signal;

applying the input signal to a delay line; and generating a plurality of first output signals for a predetermined period as the input signal propagates through the delay line, the number of first output signals being generated being indicative of the frequency of the clock signal.

30. The method of claim 29 further comprising changing the state of a second output signal responsive to each of the first output signals so that the number of transitions correspond to the frequency of the clock signal.

31. The method of claim 28 wherein the act of generating the control signal responsive to the command signal comprises:

applying the command signal to a delay line having a plurality of delay stages;

selecting one of the delay stages during the first period of the clock signal, the selected delay stage corresponding to the frequency of the clock signal;

allowing the command signal to propagate through the delay stages during the second period of the clock signal; and generating the control signal when the command signal has propagated to the selected delay stage.

* * * * *